United States Patent [19]

Chau et al.

[11] E Re. 31,056

[45] Reissued Oct. 12, 1982

[54] COMPUTER CONTROLLED HIGH-SPEED CIRCUIT FOR TESTING ELECTRONIC DEVICES

[75] Inventors: Yuk B. Chau, Torrance; George Niu, Sunnyvale; Rudolph Staffelbach, Santa Clara, all of Calif.

[73] Assignee: Fairchild Camera & Instrument Corp., Mountain View, Calif.

[21] Appl. No.: 154,151

[22] Filed: May 28, 1980

Related U.S. Patent Documents

Reissue of:

[64] Patent No.: 4,092,589
Issued: May 30, 1978
Appl. No.: 780,382
Filed: Mar. 23, 1977

[51] Int. Cl.[3] ..... G01R 15/12; G01R 31/02

[52] U.S. Cl. ..... 324/73 R; 371/1; 371/20; 371/25

[58] Field of Search ..... 324/73 R, 73 AT; 371/1, 371/20, 25; 307/240; 363/71, 72

[56] References Cited

U.S. PATENT DOCUMENTS 3,227,889 1/1966 Paynter ..... 307/240 X
3,976,940 8/1976 Chau et al. ..... 324/73 R

*Primary Examiner*—Gerard R. Strecker
*Attorney, Agent, or Firm*—Kenneth Olsen; Michael J. Pollock; Theodore Scott Park

[57] ABSTRACT

High-speed testing circuitry which, when coupled to one terminal of a multi-terminal electronic device, such as an integrated circuit, can either supply test stimuli signals up to a frequency of 30 MHz, receive output signals produced by the device under test in response to test stimuli signals applied by associated test circuits and compare these signals against computer predicted signals, or provide for parametric testing of the device.

8 Claims, 4 Drawing Figures

COMPUTER CONTROLLED HIGH-SPEED CIRCUIT FOR TESTING ELECTRONIC DEVICES

Matter enclosed in heavy brackets [ ] appears in the original patent but forms no part of this reissue specification; matter printed in italics indicates the additions made by reissue.

*BACKGROUND OF THE INVENTION*

*1. Field of the Invention*

This invention is for high-speed testing circuitry particularly useful for the production testing of high-speed electronic devices.

*Description of the Prior Art*

[It is similar to, but an improvement over that invention described and claimed in] U.S. Pat. No. 3,976,940, which was assigned to the assignee of the present invention[. This prior art patent], describes a computer-controlled testing circuit containing high-speed switching circuitry that applies two predetermined reference voltage levels, representing the two binary states, to an input terminal of an electronic device under test (DUT). When the testing circuit is connected to an output terminal of the DUT, the test stimuli signals produced by another identical testing circuit will produce two-level output signals from the DUT that are compared in the testing circuitry with signals predicted by the associated computer to detect functional errors.

This prior art test circuit materially advanced the state of the existing art by increasing the then upper limit testing frequency from approximately 5 MHz to a greatly improved 10 MHz.

[The circuitry of the present invention is a further improvement and is capable of functionally testing electronic devices at a rate of 30 MHz, as will be shown in greater detail hereinbelow.]

BRIEF SUMMARY OF THE INVENTION

The high-speed testing circuit of the invention may be operated in any one of three modes. In its parametric testing mode, it merely provides an interconnection between the associated test system computer and one terminal of the device under test (DUT). In the stimulation mode, the high-speed test circuit may be connected to an input terminal of a DUT to provide input signals at any two of four voltage reference levels representing the two binary states, which signals are switched to and from those two states at signal frequencies up to 30 MHz without switching transients by a novel dual bridge drive circuit.

In its signal-receiving mode, the output signals from the [device] *DUT*, now being driven by input signals from another test circuit in its stimulation mode, are applied to a comparator which compares these signals with reference signals predicted and supplied by the associated test system computer.

A separate skew adjusting circuit having both coarse and fine adjustments is included in the stimulation circuitry for adjusting both lead and lag edges of the signal to align with the edges of test stimuli signals supplied by other associated testing circuits. A similar dual skew adjustment circuit is provided at the output of the comparator to compensate for the various propagation delays and to align the edges of the pulses from the comparator with those of other associated test circuits.

BRIEF DESCRIPTION OF THE DRAWINGS

In the drawings which illustrate the preferred embodiment of the invention.

DETAILED DESCRIPTION

Figure 1:
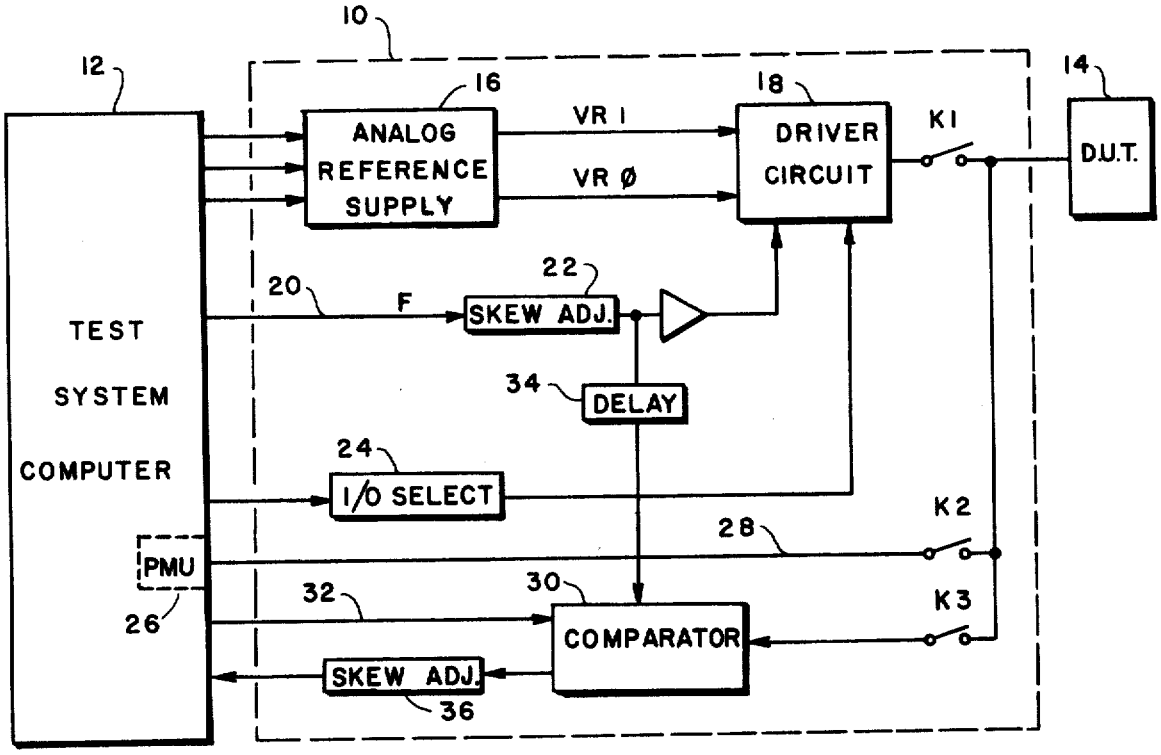
FIG. 1 is an overall block diagram of a circuit testing system which includes the testing circuit of the present invention.

Turning now to a detailed description of the invention, FIG. 1 is an overall block diagram illustrating the testing circuit 10 coupled between a test system computer 12 and a device under test (DUT) 14. In practice, one test circuit 10 is coupled to each terminal of the multi-terminal DUT 14 and is capable of being operated by the computer 12 in any one of three modes, depending upon whether the circuit 10 is coupled to a DUT input signal terminal, output signal terminal, or other various function or supply terminals. Thus, a DUT 14 having, for example, sixteen terminals or pins, would be tested in a fixture containing sixteen identical testing circuits 10 controlled by a single test system computer 12.

If, for example, the testing circuit 10 of FIG. 1 is coupled to a signal input terminal of DUT 14, the computer 12 which contains a stored program specifically written to test the particular DUT, will first close relay contact K1 to connect the test stimuli section of the circuit 10 to the DUT 14. This section includes an analog reference supply 16 which, in response to the program from computer 12, produces two levels of D.C. reference voltages designated VR0 and VR1, the low and high voltage levels of the pulse pattern to be applied to the DUT 14. The selected VR0 and VR1 voltage levels are applied to a driver circuit 18 which switches between the two voltage levels to produce a pattern of pulses in accordance with the data input or F input generated within the computer and transmitted by way of the data input line 20 to a skew adjusting circuit 22 which may be manually adjusted to align the leading and the lagging edges of the input signal to conform with leading and lagging edges of other associated circuits coupled to the DUT 14 and being operated in the test stimuli mode. The computer 12 also applies to the circuit 10 an input-output select signal which activates the I/O select circuit 24 which opens or closes a high-speed gate in the driver circuit 18 to either stop or admit the flow of data pulses into the DUT 14.

The circuit test system is also capable of performing parametric tests on the DUT 14. A parametric (or D.C.) test allows a voltage or current to be measured on any input or output pin of the DUT, while forcing a current or voltage simultaneously. This type of testing is performed by a precision measurement unit (PMU) 26 located within the test system computer 12. Parametric testing is essential for defining minimum parameters for semiconductor devices (as well as other types of circuits), such as saturation voltage, input leakage current, etc. When being operated in this mode, the computer 12 closes only the relay contact K2 so that the DUT 14 is coupled into the PMU unit 26 of the computer 12 via the conductor 28.

When the testing circuit 10 is coupled to a signal output terminal of the DUT 14, the computer 12 closes only relay contact K3 so that the DUT output signals that are generated in response to test stimuli signals from other testing circuits driven by the computer 12 will be applied directly to a comparator 30, which also receives the predicted signals from the computer 12 via the input line 32. In addition, a data input signal from the stimuli section of the circuit 10 is transmitted through a delay line 34 to the comparator [40] *30*. The delay in the delay line 34 is calculated to be substantially equal to the propagation losses through the driver circuit 18 and portions of the comparator circuit 30 and the delayed signals are used to switch the output signals of the comparator in accordance with the input data applied to the DUT 14. At the output of the comparator 30 is a skew adjusting circuit 36 which is identical with and similar in operation to the circuit 22. The output of the skew adjusting circuit 36 is applied back into the test system computer 12 which registers either acceptance or rejection of the DUT 14.

Figure 2:
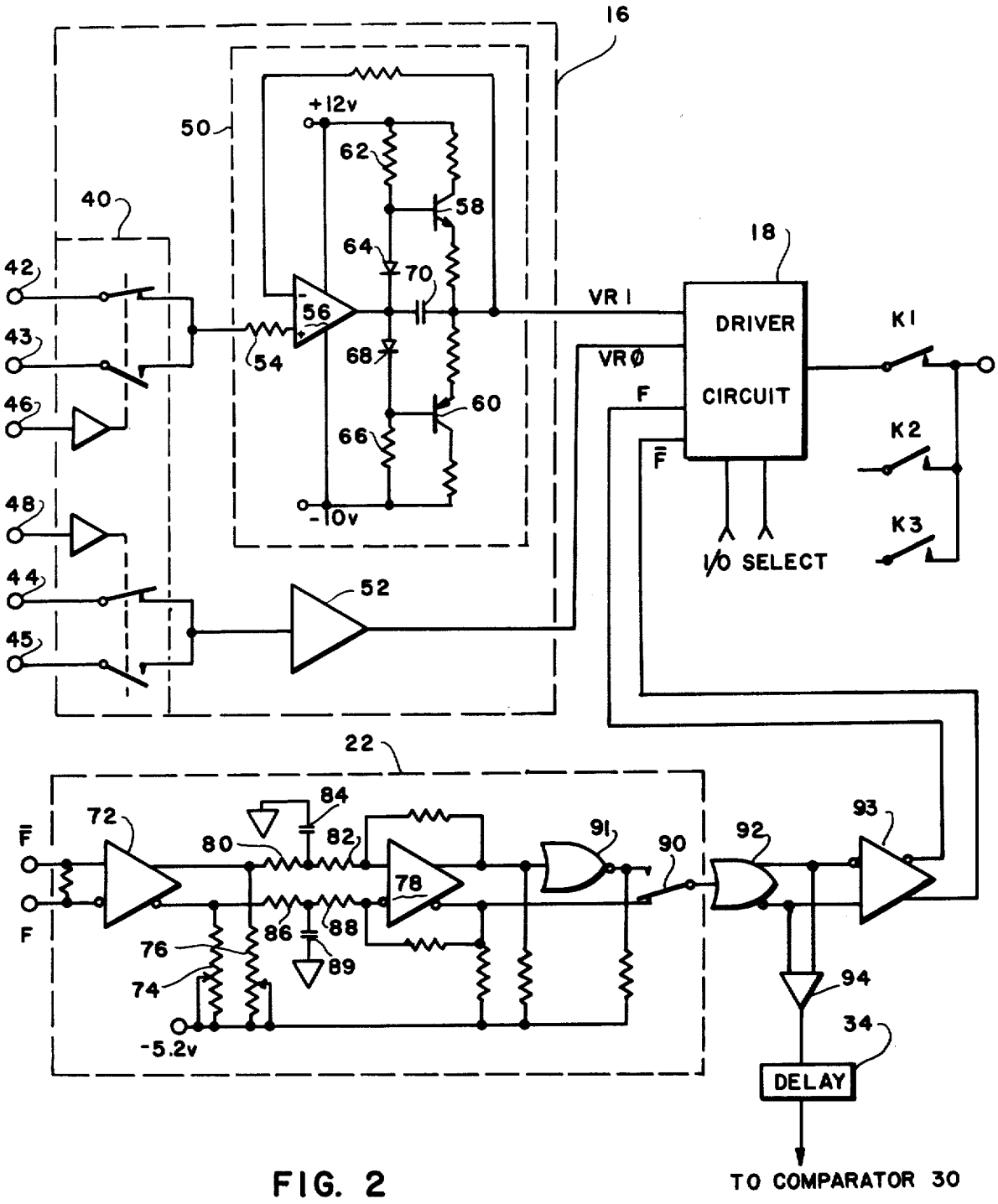
FIG. 2 is a schematic diagram of the analog reference supply and skew adjusting circuits of FIG. 1.

FIG. 2 illustrates in better detail the analog reference supply 16 and skew adjustment circuit 22 of FIG. 1.

The function of the analog reference supply 16 is to provide a pair of D.C. output signals, VR0 and VR1, representing the two binary voltage levels of the pulse train that will be applied to the device under test. DUT 14 may contain TTL, ECL, or FET circuitry, each of which must be tested with pulses having various voltage levels. Therefore, the reference supply 16 must be capable of providing those levels as dictated by the program of the computer 12. The actual voltage levels are produced by the test system computer and two pairs of high and low reference voltages are introduced to the input terminals of a multiplex switch circuit 40 shown by dashed lines within the analog reference supply 16 of FIG. 2. Thus, two different voltage level signals representing the reference voltages VR1 and two representing VR0 are applied from the computer to the input terminals 42, 43 and 44 and 45, respectively. The selection of the appropriate VR1 and VR0 signal is made by the computer by applying an excitation signal to the input terminals 46 and 48. Therefore, appropriate excitation of the multiplex circuit 40 by the system test computer 12 will produce output voltage levels from the multiplex switch 40 that are of a constant level and are without switching transients or glitches that are inherent during normal voltage switching operations. In operation, therefore, while the multiplex switch 40 is connected to output one pair of voltage levels, the test computer will apply the next voltage levels to be used in the test, thus providing a settling time and a resulting elimination of switching glitches.

The selected voltage levels VR0 and VR1 are applied to the reference supply circuitry 50 and 52. In FIG. 2, the circuitry 52 is shown as an amplifier and is identical with the circuitry 50 which is illustrated in detail within the dashed section in the analog reference supply 16 of FIG. 2. Thus, the following description of the circuitry 50 is intended to also apply to the circuitry 52.

One output of the multiplexing switch 40 is applied through a 10K resistor 54 to the non-inverting input terminal of a fast unity gain operational amplifier 56 coupled between a +12 volt and a −10 volt power source. The output of amplifier 56 drives a voltage following current buffer circuit capable of generating an output of approximately 20 ma. at the same voltage level as that applied to the reference supply 16 by the system computer 12. In the embodiment illustrated, the current buffer includes a balanced circuit containing an NPN transistor 58 in series with a PNP transistor 60. The collector of transistor 58 is coupled through suitable resistance to the positive 12-volt source and the collector of the transistor 60 is coupled through an identical resistor to the negative 10-volt source. The emitters of transistors 58 and 60 are connected together through a pair of matched resistors in a push-pull configuration, the interconnection point of which is coupled to the output line of the reference supply circuitry 50.

The base of transistor 58 is coupled to the positive voltage source through a resistor 62 and to the output terminal of the amplifier 56 through a forward biased diode 64. Similarly, the base of transistor 60 is connected to the negative voltage source through a resistor 66 which is identical in value to resistor 62, and is also connected to the cathode of a diode 68, the anode of which is coupled to the output of the amplifier 56. The output of amplifier 56 is coupled through a capacitor 70 to the output line of the circuit 50, and the output line of circuit 50 is also coupled to provide feed-back to the inverting terminal of the amplifier 56. Thus, the voltage level applied to the multiplexing switch from the system computer is duplicated by the amplifier 56, the output of which controls the gating of the transistors 58 and 60 so that the circuit output line, which is centered between the emitters of the two transistors 58 and 60, will be at an identical potential level, VR1.

Similarly, the circuitry 52 provides a VR0 signal at a level dictated by the system computer. Both the VR0 and the VR1 voltage levels are then applied to the driver circuit 18 which, in effect, operates as a single-pole double-throw switch that is toggled at a rate of up to 30 MHz by the data input, hereafter designated F, from the test system computer 12.

It will be appreciated that many devices to be tested by the testing circuitry of the invention may require several simultaneous test stimuli signals from other testing circuits incorporated in the circuit testing system and that it is essential that adjusting means are provided for assuring that all test stimuli signals are properly timed so that all leading and trailing edges of all test stimuli signals applied to the DUT 14 are in proper correspondence and alignment. Therefore, the F signals provided by the system computer 12 are applied to a skew adjustment circuit 22, such as that shown in detail within the dashed line 22 of FIG. 2. The skew circuit illustrated in FIG. 2 is similar to that described and claimed in the aforesaid U.S. Pat. No. 3,976,940, except that the improved skew adjustment circuit of the present invention has both coarse and fine skew adjustment provisions, whereas, the aforementioned patent describes only a fine skew adjustment means. The skew adjustment circuit permits independent adjustment of the leading and trailing edge delay of F data as it propagates from the input lines from the system computer 12 to the DUT 14.

The F input data signals from the system computer 12 are coupled to the non-inverting and the inverting inputs of an amplifier 72 which, because of the very high speeds involved, is preferably a high-speed differential amplifier often referred to as a line receiver. The inverting output terminal of amplifier 72 is coupled to a −5.2 volt supply through a variable resistor 75 and the non-inverting output of the amplifier is coupled to the negative source through an identical variable resistor 76.

Varying of the resistor 74 will advance or delay the trailing edge of the F data and varying the value of resistor 76 will advance or delay the leading edge of the F data.

The non-inverting output of amplifier 72 is connected to the non-inverting input of a similar amplifier 78 through series resistors 80 and 82, the junction of which is connected through a small capacitor 84 to ground reference. Similarly, the inverting output of amplifier 72 is coupled to the inverting input of amplifier 78 through series resistors 86 and 88, the interconnection of which is coupled to ground through a small capacitor 89.

The inverting output of the amplifier 78 is connected directly to one terminal of a single-pole double-throw switch 90, while the non-inverting output of the amplifier 78 is connected through a NOR-gate 91 to the second terminal of the single-pole double-throw switch 90. NOR-gate 91 is preferably a high-speed ECL circuit that will provide a propagation delay of between one and one-half and two nanoseconds and, when incorporated into the circuit by switch 90, provides a coarse adjustment to the skew adjustment circuit 22. Thus, adjustment of the potentiometers 74 and 76 will provide a smooth and fine adjustment of approximately two nanoseconds to the leading and trailing edges of the F data signal, while the addition of the NOR-gate 91 of the circuit will add an additional step adjustment of approximately two nanoseconds.

The output of the skew adjustment circuit is applied to the input of an OR/NOR gate 92, the output signals of which are then applied to an amplifier 93, the output of amplifier 93 being applied to the driver circuit 18, as illustrated in FIG. 2. The skew adjusted F data signals are also sampled at the output of the OR/NOR gate 92 and applied through an amplifier 94 to a time delay circuit 34, the output of which is applied to the comparator circuit 30, as will be subsequently described.

Figure 3:
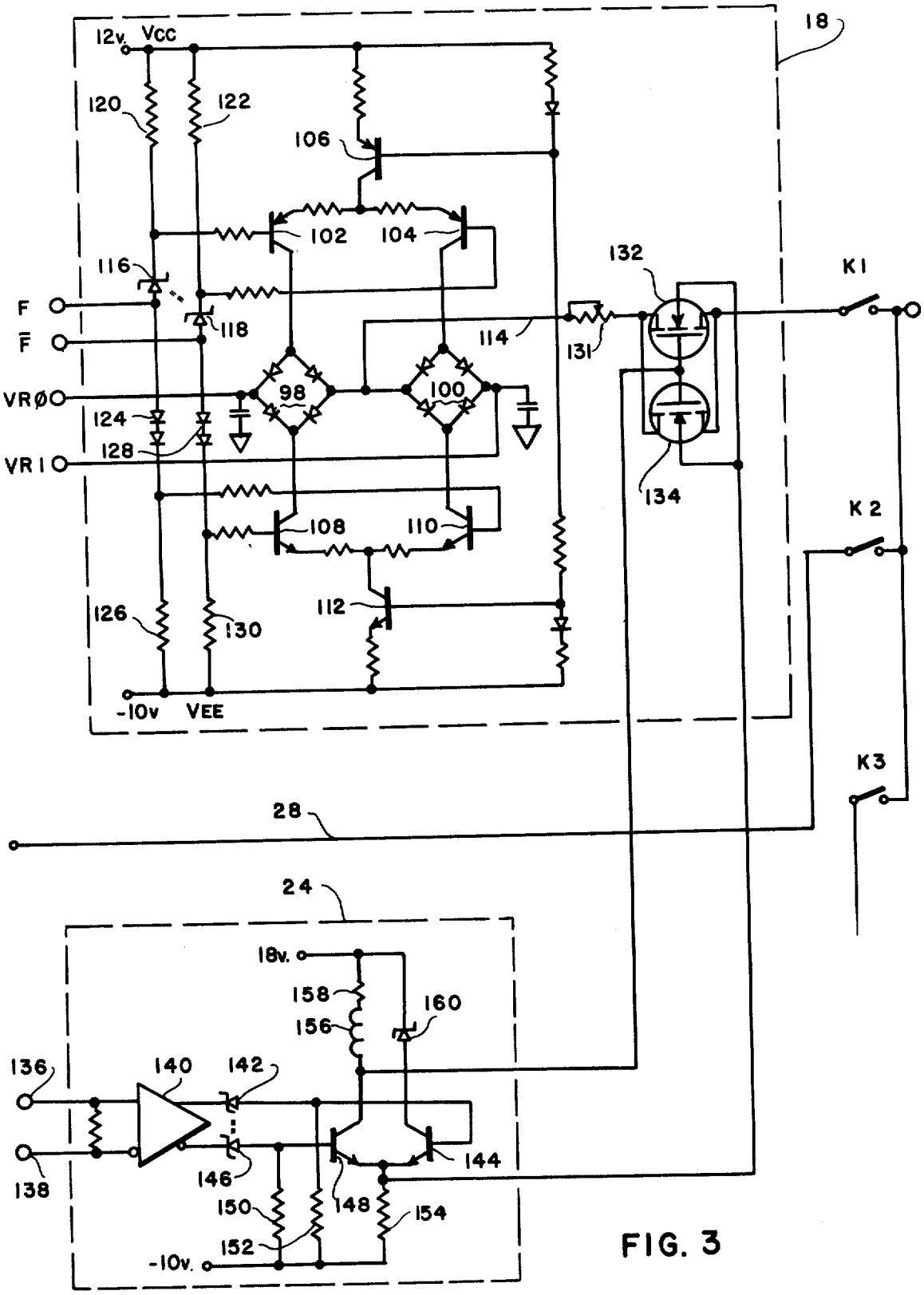
FIG. 3 is a schematic diagram illustrating the drive circuit and the input-output select circuit of FIG. 1.

FIG. 3 includes detailed schematic diagrams of the driver circuit 18 and the input/output select circuit 24, as previously mentioned in connection with FIG. 1. As shown in FIG. 3, the F data signals produced at the output of the skew adjustment circuit 22 of FIG. 2, is applied to the F and [$\overline{F}$] *F* input terminals, and the two voltage level signals produced by the analog reference supply 16 of FIG. 2 are applied to the VR0 and VR1 input terminals of the driver circuit 18 of FIG. 3.

The driver circuit 18 includes two diode bridge circuits 98 and 100 operated as high-speed switches. The interconnected diode anodes in the bridge 98 are connected to the collector of a PNP transistor 102 and the interconnected anodes in the bridge 100 are connected to the collector of an identical PNP transistor 104. The emitters of transistors 102 and 104 are connected together through balanced series resistors, the interconnecting point of which is connected to the collector of a PNP transistor 106, the emitter of which is connected through a low value resistor to $V_{CC}$, a source of positive voltage, the interconnected diode cathodes in the bridge 98 are connected to the collector of NPN transistor 108 and the interconnected cathodes in the diode bridge 100 are connected to the collector of an identical NPN transistor 110. The emitters of transistors 108 and 110 are connected together through balanced series resistors and to the collector of NPN transistor 112, the emitter of which is connected to the $-V_{EE}$ supply through a suitable resistor to provide a constant current source for the differential pair. One side of the diode bridge 98 is connected to the VR0 input terminal and the corresponding input of the diode bridge 100 is connected to the VR1 input terminal. Characteristics of bridge networks of the type described herein are that the bridge is self-balancing, it is self-compensating as a function of temperature, and has the ability to operate as a floating network. Thus, if current is permitted to flow through one diode bridge, such as a current flow through transistor 102, diode bridge 98, and transistor 108, a voltage level applied to the VR0 input corner of the bridge will be duplicated at the opposite corner and to the output line 114. Thus, the terminals of bridges 98 and 100 that are symmetrically opposite the terminals to which are applied the VR0 and VR1 signal levels, are connected together and to the output line 114 of the bridge switching circuit.

The bridges 98 and 100 are actuated by a current flow through their associated transistor switches. Thus, when transistors 102 and 108 are conductive, current will flow through the bridge 98 and a voltage will be produced on the output line that precisely corresponds to the voltage level applied to VR0 input terminal. Conversely, switching to the high pulse level will switch off transistors 102 and 108 and will render transistors 104 and 110 conductive to permit a flow of current through the bridge 100 and so that the VR1 voltage applied to the bridge will be translated to the output line 114.

It will be appreciated that the two F data input signals were adjusted and amplified in high-speed ECL circuit components which typically produced a high level output voltage of approximately $-0.8$ volts and a low level output voltage of approximately $-1.7$ volts. Since these ECL level swings must drive switching transistors in the drive circuit 18, it is first necessary to apply these signals to a signal translator which will convert the levels to those suitable for the switching operations. Therefore, the F input terminal of the drive circuit 18 is connected to the anode of a Zener diode 116 and the [$\overline{F}$] *F* input terminal is connected to the anode of a Zener diode 118. Zener diodes 116 and 118 are carefully matched, each having a Zener voltage of preferably 8.2 volts. The cathode of Zener diode 116 is connected through a resistor 120 to the $+12$ volt $V_{CC}$ supply and the cathode of Zener diode 118 is coupled through an identical resistor 122 to the positive supply. The anode of Zener diode 116 is connected to the anode of a [diode] *pair of similar diodes* 124 [, the cathode of which is] connected in series [with a similar diode] and through a resistor 126 to a $-10$ volt supply. Similarly, the anode of Zener diode 118 is coupled through two diodes in series 128 and through resistor 130 to the negative supply. *Resistors 120 and 126 are substantially identical to resistors 122 and 130, respectively.* The cathode of Zener diode 116 is also coupled through a resistor to the base of PNP transistor 102 and the cathode of Zener diode 118 is coupled through a similar resistor to the base of PNP transistor 104. The base of NPN transistor 110 is coupled through a resistor to the point interconnecting the resistor 126 with the series diodes 125 and the base of NPN transistor 108 is coupled through an identical resistor to the junction of resistor 130 and the diode pair 128.

The matched Zener diodes 116 and 118, together with their associated series resistors, form the signal translator that translates the ECL levels applied to the F and [$\overline{F}$] *F* input terminals into voltage levels suitable for switching the transistors 102, 104, 108 and 110. An example of the operation of the signal translator is as follows: Assume a high level ECL input is applied to the input terminals so that the voltage level appearing at the F terminal may be −0.8 and at the [$\bar{F}$] *F* terminal, −1.7. There is a normal current flow through each signal translator circuit between the +12 volt and −10 volt supplies and there is a constant 8.2 volt drop across each Zener 116 and 118. Therefore, a −0.8 volt signal appearing on the anode of the Zener diode 116 will be translated to a +7.4 volt level at the cathode of Zener diode 116. Similarly, a −1.7 volt applied to the anode of Zener diode 118 will be raised to the level of +6.5 volts at the cathode. In the example, a potential of 7.4 volts is now applied to the base of [NPN] *PNP* transistor 102 and 6.5 volts is applied to the base of [NPN transistor 102 and 6.5 volts is applied to the base of NPN] *PNP* transistor 104, thereby turning on transistor 104 and turning off transistor 102.

The two pairs of series diodes 124 and 128 provide a 1.2 volt drop below that applied to the input terminals. Thus, in the example of the operation of the circuit, the −0.8 volt signal at the F terminal will drop to −2 volts across the diodes 124 and this level will be applied to the base of the NPN transistor 110. The −1.7 volts applied to the [$\bar{F}$] *F* input terminal will similarly be lowered to [−3.9] *2.9* volts at the base of NPN transistor 108. Thus, transistor 108 will be turned off and transistor 110 will turn on. The flow of current through the constant current source transistor 106, switching transistor 104, bridge 100, transistor 110 and the constant current source transistor 112 will therefore enable the bridge 100 so that the VR1 signal applied to the bridge will be repeated as VR1 on the output line 114.

When the data input is switched, the F input, previously at −0.8 volts, will drop to −1.7 volts and the [$\bar{F}$] *F* input will switch from the −1.7 volts to −0.8 volts. The translator diodes having a Zener voltage of 8.2 volts will then translate these data input signals so that the [$\bar{F}$] *F* input of −0.8 volts will apply +7.4 volts to the base of transistor [102] *104* and the F input of −1.7 volts will be translated to +6.5 volts and applied to the base of transistor [104] *102*. Thus, transistor 102 will turn on and transistor 104 will turn off. Similarly, the two pairs of diodes 124 and 128 will further drop the data input voltage levels by 1.2 volts to apply −2.0 volts to the base of NPN transistor [110] *108* and [−3.9] *−2.9* volts to the base of transistor [108] *110* thereby turning on transistor 108 and turning off transistor 110. Current now no longer flows through the branch containing diode bridge 100 and the VR1 voltage level applied to the bridge 100 is not translated to the output line. Instead, bridge 98 is conducting and the VR0 level applied to that bridge now is repeated on line 114. As the input data is switched on the F and [$\bar{F}$] *F* input terminals, the current flow through the bridges 98 and 100 will be similarly switched and are capable of being switched at extremely high speeds to produce a train of output pulses that will provide test stimuli signals of up to 30 MHz to the DUT 14.

The output of the bridge switching circuit in the driver circuit 18 is applied via output conductor 114 and through an output impedance matching potentiometer 131 to the interconnected source terminals of two parallel connected double-diffused N-channel enhancement-type field effect DMOS transistors 132 and 134 which are operated as extremely high-speed switches to switch the data signal on or off to the DUT 14. Therefore, the drain terminals of DMOS transistors 132 and 134 are coupled together and to one contact of the switch K1, and the gate terminals of the DMOS transistors are coupled together for control by the input-output select circuit 24.

The input-output select circuit 24 is controlled by the test system computer 12 which applies signals to the input terminals 136 and 138 of the circuit 24. Terminal 136 is coupled to the non-inverting input terminal of an amplifier 140 which, because of the high switching speed requirement, should be an ECL circuit, such as the type often designated as a line receiver. Similarly, the terminal 138 is applied to the inverting input terminal of the amplifier 140. Because the output signals from the amplifier 140 are at the ECL levels and not suitable for the control of the following transistor circuit, the output signals are applied through a signal translator similar to that described in connection with the driver circuit 18. Therefore, the non-inverting output of amplifier 140 is applied through a Zener diode 142 to the base of NPN transistor 144 and the inverting output of amplifier 140 is applied through an identical matched Zener diode 146 to the base of NPN transistor 148. The base of transistor 148 is coupled to the −10 volt supply through a resistor 150 and the base of transisor 144 is coupled to the negative supply through an identical resistance 152. The emitters of transistors 144 and 148 are connected together and to the negative supply through a resistor 154 which forms a constant current source for the differential transistor pair 144 and [150] *148*. The collector of transistor 148 is connected to a +18 volt supply through a series-connected resistor 158 and choke 156 which functions to speed up the driving signals to the gates of the DMOS transistors 132 and 134. The collector of transistor 148 is also connected to the interconnected gate terminals of the DMOS switching transistors 132 and 134. The collector of transistor 144 is connected to the anode of a 16 volt Zener diode 160, the cathode of which is coupled to the +18 volt supply. The purpose of the Zener diode 160 is to balance the ON/OFF current through transistors 144 and 148. When transistor 144 is conducting, current flows from the +18 volt supply to the −10 volt supply through Zener diode 160, transistor 144 and resistor 154. When transistor 144 is suddenly switched off and transistor 148 is switched on, the same amount of current will flow through resistance 158, choke 156, transistor 148 and the 100-ohm [resistance] *resistor 154*. Thus, there is no current change between on and off state, and voltage spikes due to current changes will be materially reduced.

In operation, when a high signal is applied to the input terminal 136, a corresponding high signal will be produced at the non-inverting output of amplifier 140 and will be applied to the base of transistor 144 to render that transistor conductive. Simultaneously, with the switching on of transistor 144, transistor 148 is switched off, thus applying a high voltage to the collector of transistor 148 and the interconnected gate terminals of the switching transistors 132 and 134, thereby rendering those transistors conductive. When the input signals to terminals 136 and 138 are switched to their opposite state, the higher level signal now on terminal 138 will be applied through amplifier 140 and across the signal translator Zener diode 146 to apply the higher level signal to the base of transistor 148. Transistor 148 is thereby turned on and transistor 144 is turned off. The collector of the conducting transistor 148 is now at a negative potential and this level is applied to the gates of the DMOS transistors 132 and 134 to render them nonconductive, thus opening the input-output switch to the DUT 14.

Figure 4:
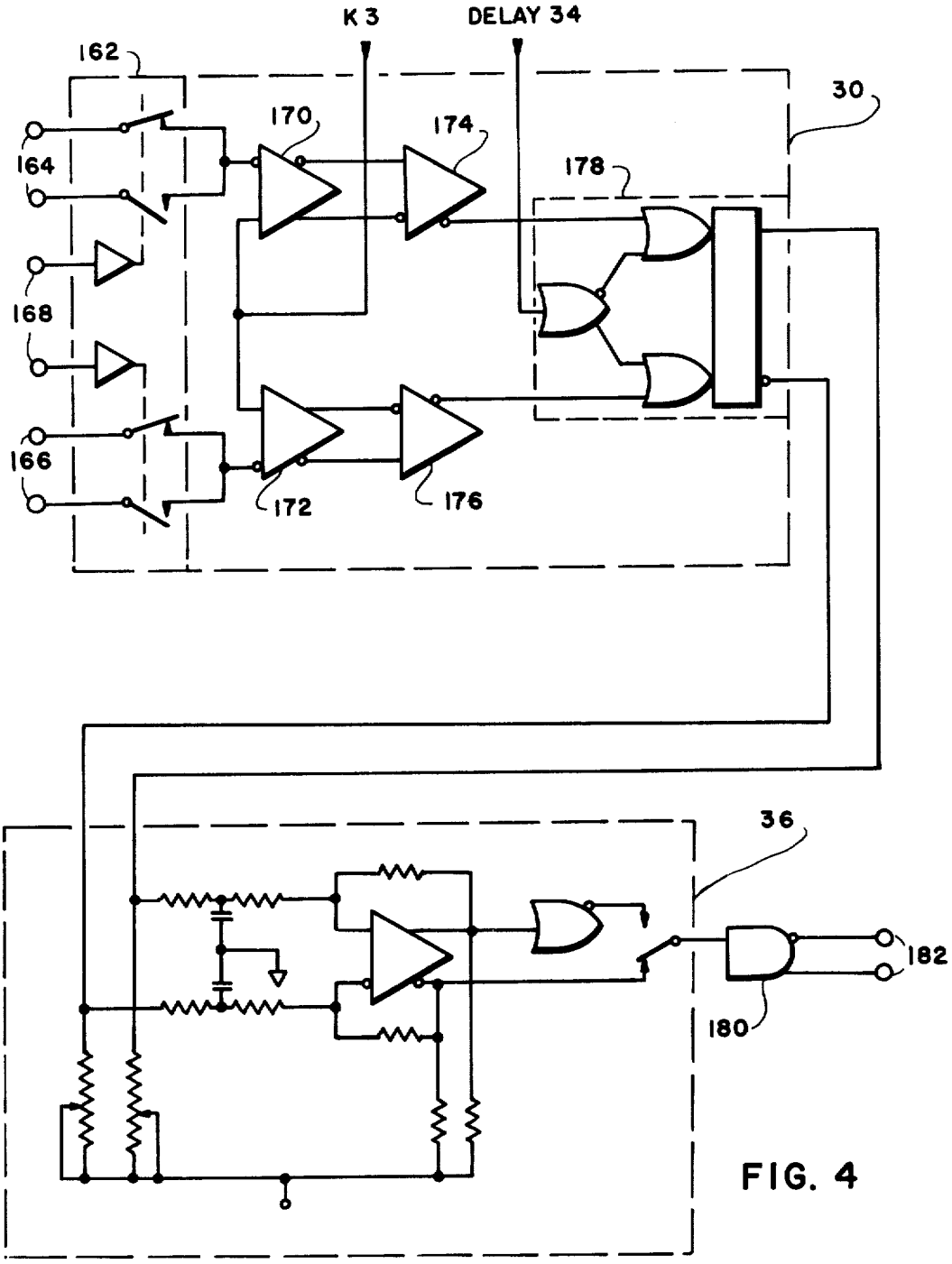
FIG. 4 is a logic diagram of the comparator and the comparator skew adjustment circuit of FIG. 1.

FIG. 4 contains a detailed block diagram of the comparator 30 of FIG. 1 and a schematic diagram of the associated skew adjustment circuit 36.

The comparator 30 receives input signals from the system computer 12 and applies them to the multiplexing switch 162 which is identical with the multiplexing switch 40 previously described in connection with the analog reference supply 16 of FIG. 2. The computer introduces D.C. signal levels representing two high and two low voltage levels to input terminals 164 and 166, respectively, and level-selecting signals to input terminals 168. The two output levels from the multiplexing switch 162 are applied to the inverting inputs of comparators 170 and 172, while input signals from the DUT 14 are transmitted through the switch K3 to both of the non-inverting input terminals of the comparators 170 and 172. Comparators 170 and 172 are readily available on the commercial market, and one such comparator that is suitable for use in the comparator circuit is the type Am687 manufactured by Advanced Micro Devices of Sunnyvale, California.

The outputs of the comparators 170 and 172 are applied to the input terminals of amplifiers 174 and 176, respectively, and the output of these amplifiers are applied to the input terminals of a multiplexer, shown within the dashed line 178. The multiplexer 178 is also a commercially available item and may, for example, be a Motorola MECL 10134 multiplexer with latch. Multiplexer 178 receives an additional input from the delay circuit 34 of FIGS. 1 and 2, which samples the F data signals and delays them by an amount equal to the propagation delays in the testing circuit. The multiplexer 178 then switches between the output levels of amplifier 174 and 176 at a rate controlled by the delayed F data. The output of the comparator 30 is, therefore, a high frequency signal similar to the test stimuli signals but at levels determined by the quality of the device under test.

It will be appreciated that a typical DUT 14 may produce several output signals in response to one or more test stimuli, and because of the very high frequency of the signals and the various propagation delays through the various circuits, it is probable that the several output signals will not be properly aligned with each other when returned to the computer 12. Therefore, the output of the comparator 30 is applied to a skew adjustment circuit 36, as shown in FIG. 4. It will be noted that the circuit 36 of FIG. 4 is identical with the coarse and fine skew adjustment circuit 22 of FIG. 2; it is therefore deemed unnecessary to describe this circuit 36 in detail.

The output of the skew adjusting circuit 36 is then buffered with an ECL gate 180 and applied back to the computer through terminals 182 for a quality determination of the device under test.

We claim:

[1. A high-speed testing circuit for applying test stimuli input signals to an electronic device and for receiving from said device output signals generated in response to test stimuli signals originating from another source, said testing circuit including:

a. voltage reference circuitry for supplying a pair of D.C. signals at first and second voltage levels, said circuitry including input means for receiving D.C. signals at first, second, third, and fourth voltage levels and means for selecting appropriate first and second levels for testing the electronic device;

b. skew adjustment circuit means for receiving a train of high frequency pulses and for adjusting the time of occurrence of the leading and trailing edges;

c. driver circuit means coupled to receive from said voltage reference circuitry said pair of D.C. signals at first and second voltage levels and for receiving the adjusted train of pulses from said skew adjustment circuit means, said driver circuit means including electronic switching means for switching to said first and to said second voltage levels at a switching rate determined by the frequency of said adjusted train of pulses to generate test stimuli signals for application to an input terminal of said electronic device.]

2. The testing circuit claimed in claim [1] *10* wherein said skew adjustment circuit means [includes coarse and] *comprises:* fine skew adjustment means[, said fine adjustment means] comprising a variable resistor-capacitor network[,]; and

[said] coarse *skew* adjustment means comprising a gate circuit having a predetermined propagation delay, said gate circuit being selectively switched into and out of said skew adjustment circuit means.

[3. The testing circuit claimed in claim 1 wherein said driver circuit means includes:

a. first and second diode bridge circuits, each having a first terminal coupled to the interconnected anodes of said diodes, a second terminal coupled to the interconnected cathodes and third and fourth terminals coupled between the cathode and anode of the diode pairs between said first and second terminals;

b. output circuitry means interconnecting said fourth terminal of said first bridge circuit and said fourth terminal of said second bridge circuit with the output conductor of said drive circuit means;

c. current switching means coupled between a first voltage supply and said first terminal of said first and second diode bridge circuits, and between a second voltage supply and said second terminals of said first and second diode bridge circuits, said current switching means coupled through common current source resistances to form a differential circuit through said first and second diode bridge circuits and said current switching means;

d. input circuit means coupled to said voltage reference circuitry for applying said D.C. signal at a first voltage level to the third terminal of said first diode bridge and said D.C. signal at second voltage level to the third terminal of said second diode bridge; and e. pulse input circuit means coupled to said skew adjustment circuit means and to said current switching means for switching current flow between said first and second diode bridge circuits at a rate determined by the frequency of said skew adjusted train of pulses.]

4. The testing circuit claimed in claim [3] *10 or 2* wherein said pulse input circuit means [includes] *comprises a* first and *a* second signal [translators] *translator* for translating the [pulse input signal voltage levels] *skew-adjusted pulses* into *the intermediate pulses at* levels required for operation of said current switching means.

5. The [circuitry] *testing circuit* claimed in claim 4 wherein each [of said first and second signal translators contain] *signal translator comprises* a Zener diode coupled between [resistances] *resistors* between [said first and second] *the* voltage supplies, the [resistances] *resistors* and Zener diode in said first *signal* translator being substantially identical with [resistances] *the resistors* and *Zener* diode in said second *signal* translator to obtain substantially equal current flows through said [first and second] *signal* translators, [said pulse input signals] *the skew-adjusted pulses* being applied to [one side] *the anodes* of said Zener diodes and [signals to switch said current switching means taken from the opposite side] *the intermediate pulses being produced at the cathodes* of said *Zener* diodes at levels differing in voltage from the [level of said pulse input signals] *levels of the skew-adjusted pulses* by the Zener voltage [rating] of said *Zener* diodes.

6. The [circuitry] *testing circuit* claimed in claim 4 wherein said [drive] *output* circuit means includes a high-speed [, normally-off] switch [in the output conductor of said drive circuit means, said switch] comprising at least one N-channel enhancement-type field effect transistor having its gate coupled for switch conduction in response to applied input-output selection signals.

7. The testing circuit claimed in claim [1] *10 or 2 and* further including comparator [circuitry coupled to receive] *means for comparing reference voltage signals with the device* output signals [from the electronic device under test], said comparator [circuitry including] *means comprising* :

*a* first [and second comparators, said first] comparator for [receiving and] comparing first *signals of the* reference voltage [levels] *signals* with *the device output* signals [from said electronic device,] *to produce first compared signals;*

[said] *a* second comparator for [receiving and] comparing second *signals of the* reference voltage [levels] *signals* with *the device output* signals [from said electronic device] *to produce second compared signals;* and multiplexing [circuitry coupled to the outputs of said first and second comparators] *means responsive to the first and second compared signals* and to the [output of said skew adjustment circuit means for control by said adjusted train of pulses] *train of skew-adjusted pulses for generating comparator output signals at a frequency corresponding to said switching rate.*

8. The *testing* circuit claimed in claim 7 *and* further including [a] delay [circuit interposed] *means coupled* between said [skew-adjustment] *skew adjustment* circuit means and said multiplexing [circuitry] *means* for [compensating] *delaying the skew-adjusted pulses to compensate* for propagation delays [between pulses in said adjusted train and the corresponding pulses received from said device] *in said driver circuit means and in said comparator means.*

9. The *testing* circuit claimed in claim 7 *and* further including second skew adjustment circuit means [coupled to the output of said comparator circuitry, said adjustment circuit means having an adjustable fine skew adjustment means and a switched coarse adjustment means] for compensating for propagation delays between the comparator [circuitry] output signals and *second comparator* output signals produced by other identical testing circuits operating in response to the [same test stimuli] *device output* signals, *said second skew adjustment circuit means comprising:*

*fine skew adjustment means; and*

*coarse skew adjustment means selectively switched into and out of said second skew adjustment circuit means.*

*10. A high-speed testing circuit for applying first test stimuli input signals to an electronic device and for receiving device output signals from said device generated in response to second test stimuli signals originating from another source, said testing circuit comprising:*

*voltage reference supply circuit means for supplying a first direct current (D.C.) reference signal at a first voltage reference level and a second D.C. reference signal at a second voltage reference level in response to D.C. input signals at a plurality of input voltage levels;*

*skew adjustment circuit means for receiving a train of high-frequency pulses and for adjusting the times of occurrences of the leading and trailing edges of the high-frequency pulses to produce a train of skew-adjusted pulses; and*

*driver circuit means responsive to the D.C. reference signals and to the train of skew-adjusted pulses for switching between the voltage reference levels at a switching rate determined by the frequency of the train of skew-adjusted pulses to generate the first test stimuli signals for application to an input terminal of said device, said driver circuit means comprising*

*a. a first and a second diode bridge circuit, each diode bridge circuit comprising a first, a second, a third, and a fourth diode and having (1) a first terminal coupled to the anodes of the first and second diodes, (2) a second terminal coupled to the cathodes of the third and fourth diodes, (3) a third terminal coupled between the cathode of the first diode and the anode of the third diode, and (4) a fourth terminal coupled between the cathode of the second diode and the anode of the fourth diode;*

*b. output circuit means coupled to the fourth terminals for transmitting the first test stimuli signals;*

*c. current switching means for switching current between said diode bridge circuits at said switching rate, said current switching means coupled between a first voltage supply and the first terminals and coupled between a second voltage supply and the second terminals, said current switching means further coupled through common current-source resistors to form a differential circuit through said diode bridge circuits;*

*d. reference input circuit means coupled to said voltage reference supply circuit means for applying the first D.C. reference signal to the third terminal of said first diode bridge circuit and the second D.C. reference signal to the third terminal of said second diode bridge circuit; and*

*e. pulse input circuit means coupled to said skew adjustment circuit means for receiving the train of skew-adjusted pulses and coupled to said current switching means for providing intermediate pulses thereto.*

* * * * *